United States Patent
Kim et al.

(10) Patent No.: US 7,682,967 B2
(45) Date of Patent: Mar. 23, 2010

(54) METHOD OF FORMING METAL WIRE IN SEMICONDUCTOR DEVICE

(75) Inventors: Eun Soo Kim, Incheon-Si (KR); Jung Geun Kim, Seoul (KR); Suk Joong Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 336 days.

(21) Appl. No.: 11/801,498

(22) Filed: May 10, 2007

(65) Prior Publication Data

US 2008/0160753 A1    Jul. 3, 2008

(30) Foreign Application Priority Data

Dec. 28, 2006   (KR) .................... 10-2006-0136120

(51) Int. Cl.
*H01L 21/4763*    (2006.01)

(52) U.S. Cl. .................. 438/638; 438/625; 438/627; 438/629; 438/687; 257/E21.579

(58) Field of Classification Search ......... 438/622–625, 438/627–629, 638, 687–688; 257/E21.579
See application file for complete search history.

(56) References Cited

U.S. PATENT DOCUMENTS

2002/0102837 A1*  8/2002  Ritzdorf et al. ............. 438/618
2005/0074966 A1*  4/2005  Rhodes ....................... 438/629

FOREIGN PATENT DOCUMENTS

| KR | 10-2001-0004743 | 1/2001 |
| KR | 2001-112891 | 12/2001 |
| KR | 10-2002-0053610 | 7/2002 |
| KR | 10-2004-0008017 | 1/2004 |

* cited by examiner

*Primary Examiner*—Thanhha Pham
(74) *Attorney, Agent, or Firm*—Marshall, Gerstein & Borun LLP

(57) ABSTRACT

A method of forming a metal wire in a semiconductor device is disclosed The method includes the steps of etching an insulating layer formed on a semiconductor substrate to form a dual damascene pattern, forming a barrier metal layer in the dual damascene pattern, forming a metal layer on the barrier metal layer, and filling the dual damascene pattern with a conductive material to form a metal wire.

20 Claims, 4 Drawing Sheets

METHOD OF FORMING METAL WIRE IN SEMICONDUCTOR DEVICE

CROSS-REFERENCE TO RELATED APPLICATIONS

The priority of Korean patent application number 10-2006-136120, filed on Dec. 28, 2006, the disclosure of which is incorporated by reference in its entirety, is claimed.

BACKGROUND OF THE INVENTION

The invention relates to a method of forming a metal wire in a semiconductor device, and more particularly, to a method of forming a metal wire in a semiconductor device that enhances the reliability of the device.

In the method of forming a metal wire in a semiconductor device, a damascene method using tungsten as a plug is employed. As the device becomes highly integrated, even though the design rule is reduced, a high driving ratio is required. Thus, a metal wire forming method using metal material having a low specific resistance and a low dielectric material (low-k) has been studied.

In general, when the metal wire is formed using a copper damascene, the process of forming the metal wire has the following drawbacks:

First, the electrons are transported mainly in metals having a low specific resistance. If the thickness of a barrier metal layer formed on the bottom portion of a contact connecting a first metal wire and a second metal wire is thick, then the transport of electrons through a copper wire having a low specific resistance is decreased. By decreasing the amount of transported electrons, copper ions diffuse into an insulating layer so that a void is generated, ions penetrate the insulating layer, and vacancies are created. Due to the above phenomenon, the metal wire breaks due to an electro-migration (EM) failure or a stress-migration (SM) failure.

Second, since copper has a large affinity for oxygen, copper is significantly oxidized when exposed at an exterior surface. This increases the a resistance of the metal layer.

Third, characteristics such as RC delay, leakage current, and time dependent dielectric breakdown are degraded by the above mentioned problems. Thus, there is a problem with the driving ratio of the device and it is difficult to reduce the size of the device.

SUMMARY OF THE INVENTION

Accordingly, the invention solves the aforementioned problems of conventional technology by providing a method of forming a metal wire in a semiconductor device comprising the step of forming a metal layer between a metal wire and a barrier metal layer formed in a dual damascene pattern to prevent copper ions of the metal wire from being diffused to an insulating layer or penetrating the insulating layer, thereby enhancing the reliability of the metal wire.

The method of forming a metal wire in a semiconductor device according one embodiment of the invention comprises the steps of etching an insulating layer formed on a semiconductor substrate to form a dual damascene pattern; forming a barrier metal layer in the dual damascene pattern; forming a metal layer on the barrier metal layer; and filling the dual damascene pattern with a conductive material to form a metal wire.

Optionally, in the above method, the insulating layer is made of a low dielectric material. The barrier metal layer is formed by depositing titanium (Ti) through a sputtering method. The metal layer comprises an aluminum layer formed using chemical vapor deposition (CVD) and has a thickness of 250 Å to 400 Å. The metal layer is hardly formed on a lower region of the dual damascene pattern, and most of the metal layer is formed on a side surface of an upper region of the dual damascene pattern. After forming the metal layer, a heat treatment process causes the metal layer to migrate into the lower region of the dual damascene pattern. The heat treatment process is carried out at a temperature of 430° C. to 450° C.

The method of forming a metal wire in a semiconductor device according to another embodiment of the invention comprises the steps of etching a first insulating layer formed on a semiconductor substrate to form a first trench; filling the first trench with a first metal layer to form a first metal wire; forming a first etching stop layer, a second insulating layer, a second etching stop layer, and a third insulating layer on the semiconductor substrate including the first metal layer; etching the third insulating layer, the second etching stop layer, the second insulating layer, and the first etching stop layer to form a dual damascene structure comprising a second trench and a via hole; forming a second metal layer on only a region of the second trench; performing a heat treatment process thereby causing the second metal layer to migrate into lower regions and along side surfaces of the second trench and the via hole; and filling the second trench and the via hole with a third metal layer to form a second metal wire.

Optionally in the additional embodiment, the first, second, and third insulating layers are made of low dielectric material. Before forming the first metal layer, a palladium layer is formed in the first trench and a barrier metal layer is then formed in the first trench. The palladium is deposited through a sputtering method and the barrier metal layer is formed by depositing tantalum (Ta) and tantalum nitride (TaN) through a sputtering method. A barrier metal layer is further formed in the second trench and the via hole prior to forming the second metal layer. The barrier metal layer is formed by depositing titanium (Ti) through a sputtering method. The second metal layer is formed by depositing aluminum (Al) using chemical vapor deposition (CVD) and has a thickness of 250 Å to 400 Å. The portion of the barrier metal layer formed on the first metal wire is removed through an etching process before performing the heat treatment process. A portion of the second metal layer formed in the second trench and on the barrier metal layer is removed during the etching process. The heat treatment process is carried out at a temperature of 430° C. to 450° C. The third metal layer comprises a copper layer formed through an electroplating method using the second metal layer as a seed layer.

BRIEF DESCRIPTION OF THE DRAWINGS

The above and other objects, features and advantages of the invention will become apparent from the following description of preferred embodiments with the accompanying drawings, in which.

DESCRIPTION OF SPECIFIC EMBODIMENTS

Hereinafter, a preferred embodiment of the invention is described in more detail with reference to the accompanying drawings.

Figure 1A:
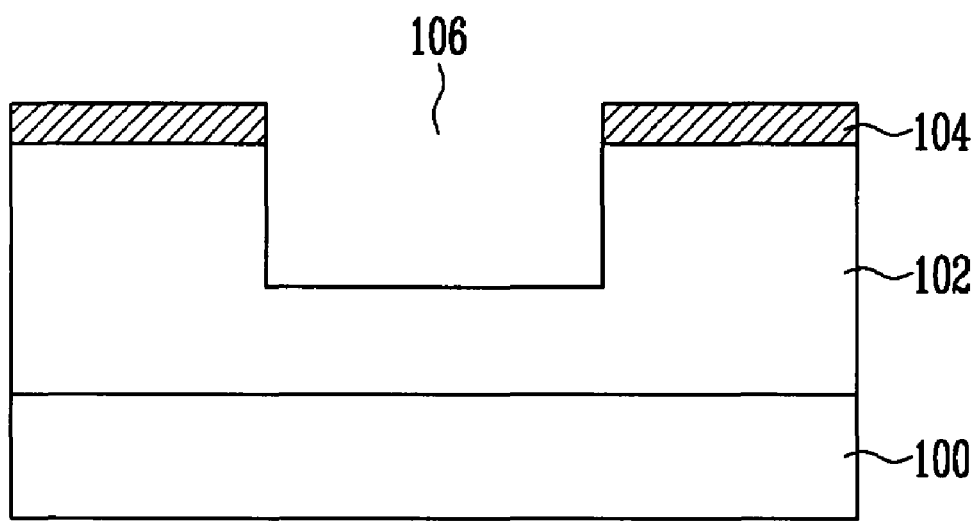
FIG. 1A to FIG. 1H are sectional views of a semiconductor device illustrating a method of forming a metal wire in a semiconductor device according to one embodiment of the invention.

Referring to FIG. 1A, a first insulating layer 102 and a first hard mask layer 104 are sequentially formed on a semiconductor substrate 100 on which a predetermined structure such as an isolation structure, a transistor, a contact plug and the like is formed. A portion of the first hard mask layer 104 and a portion of the first insulating layer 102 are then etched to form a first trench 106 for a first metal wire. The first insulating layer 102 can be made of a low dielectric material (low-k) and the first hard mask layer 104 can be made of silicon carbonitride (SiCN)

Figure 1B:
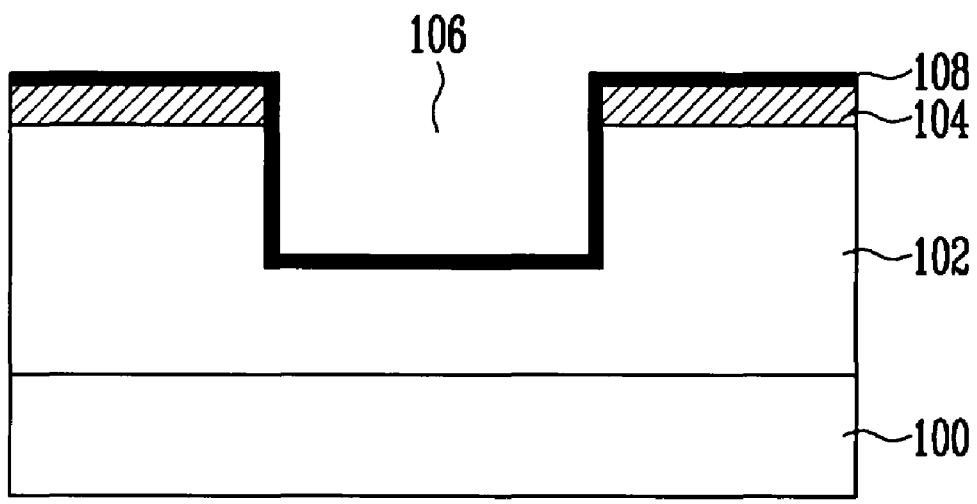

Referring to FIG. 1B, a palladium (Pd) layer (not shown) is thinly applied to the resulting surface including the first hard mask layer 104 and the first trench 106 through a sputtering method. A linear-shaped first barrier metal layer 108 is then formed on the palladium layer. The first barrier metal layer 108 can be formed by depositing tantalum (Ta) and tantalum nitride (TaN) through a sputtering method.

Figure 1C:
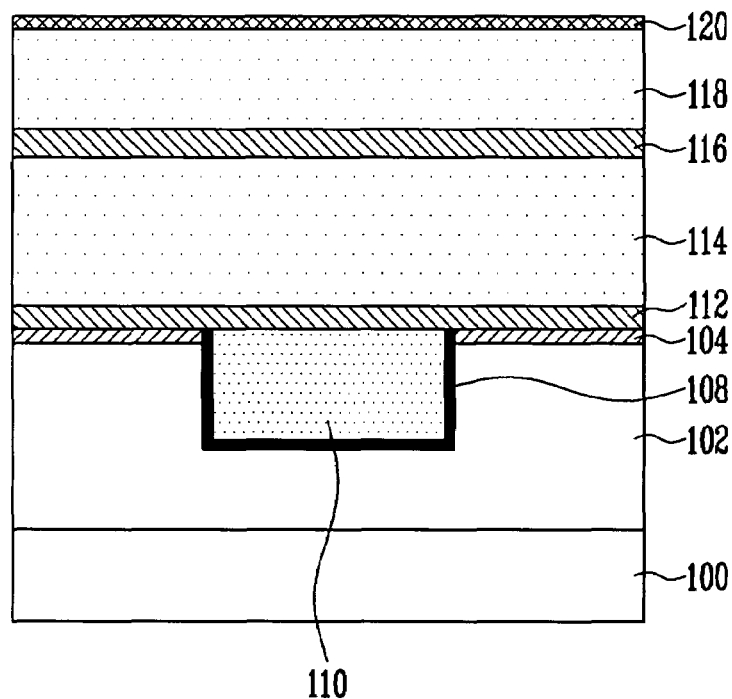

Referring to FIG. 1C, a first metal layer is formed on the semiconductor substrate 100 including the first barrier metal layer 108 to fill the first trench 106 with the first metal layer. The first metal layer may be made of copper (Cu). When the first metal layer is made of copper, a copper seed layer is formed first through a physical vapor depositing (PVD) method or a chemical vapor deposition (CVD) method. Then, an electroplating method is carried out to fill the first trench 106 with the first metal layer.

Then, a chemical mechanical polishing (CMP) step is performed to remove the portions of the first metal layer outside the first trench 106, thereby forming a first metal wire 110. In the chemical mechanical polishing process for forming the first metal wire 110, the portion of the first barrier metal layer 108 formed on the first hard mask layer 104 is removed together with the first metal layer. A first etching stop layer 112 is then formed on the semiconductor substrate 100 including the first metal wire 110. The etching stop layer 112 can be made of silicon carbonitride (SiCN) Then, a second insulating layer 114, a second etching stop layer 116, a third insulating layer 118 and a second hard mask layer 120 are sequentially formed on the first etching stop layer 112. The second and third insulating layers 114 and 118 can be made of low dielectric material and the second hard mask layer 120 can be made of silicon carbonitride (SiCN).

Figure 1D:
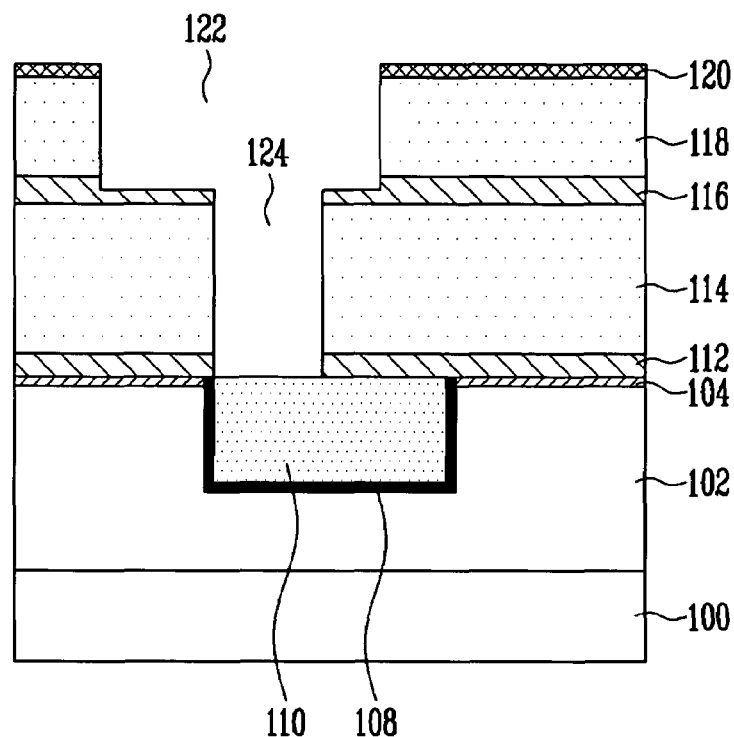

Referring to FIG. 1D, a portion of the second hard mask layer 120 and a portion of the third insulating layer 118 are etched to form a second trench 122. Subsequently, the second etching stop layer 116, the second insulating layer 114 and the first etching stop layer 112 are sequentially etched to form a via hole 124. From this, a dual damascene structure including the second trench 122 and the via hole 124 is formed. During the etching process for the second insulating layer 114, etching is primarily halted on the first etching stop layer 112 and the first etching stop layer 112 having a relatively low thickness is etched to expose the first metal wire 110. Thus, the first metal wire 110 is not excessively etched.

Figure 1E:
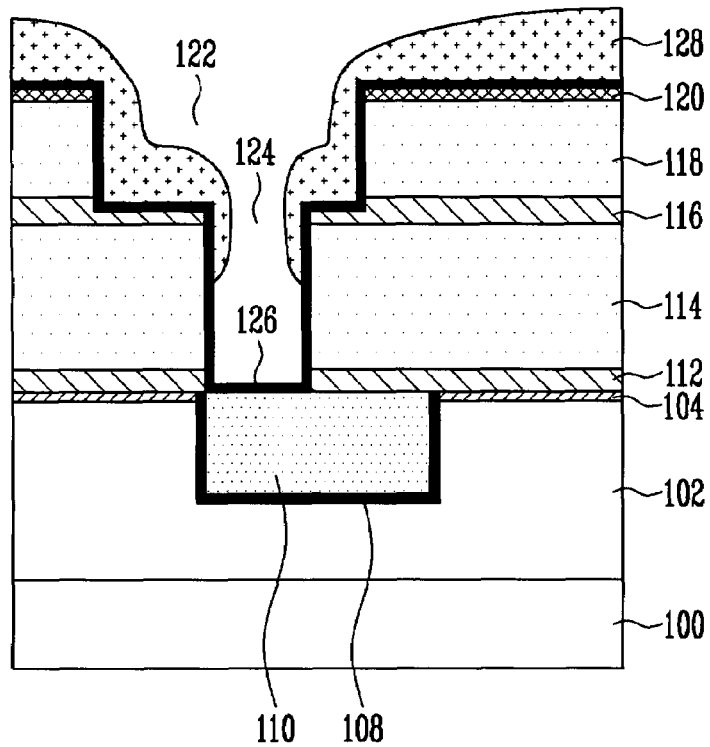

Referring to FIG. 1E, a second barrier metal layer 126 is formed in a liner shape on the resulting semiconductor substrate 100 including the via hole 124 and the second trench 122. The second barrier metal layer 126 may be formed by depositing titanium (Ti) through a sputtering method.

Then, a second metal layer 128 is formed on the second barrier metal layer 126. The second metal layer 128 can be made of aluminum (Al) using CVD, and can have a thickness of 250 Å to 400 Å Due to the deposition characteristics of the metal, the second metal layer 128 is hardly formed on the lower region of the via hole 124, and most of the second metal layer 128 is formed on the side wall and the bottom surface of the second trench 122.

Figure 1F:
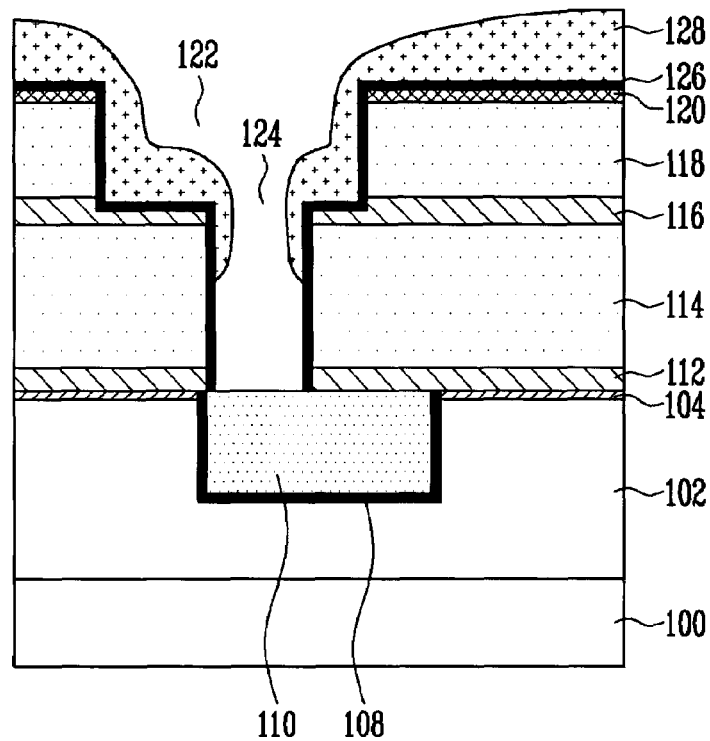

Referring to FIG. 1F, an etching process is performed to remove the second barrier metal layer 126 formed on the bottom surface of the via hole 124 and on the metal wire 110. When the etching process is performed, a portion of the second metal layer 128 formed on the second barrier metal layer 126 and in the second trench 122 may be removed.

Figure 1G:
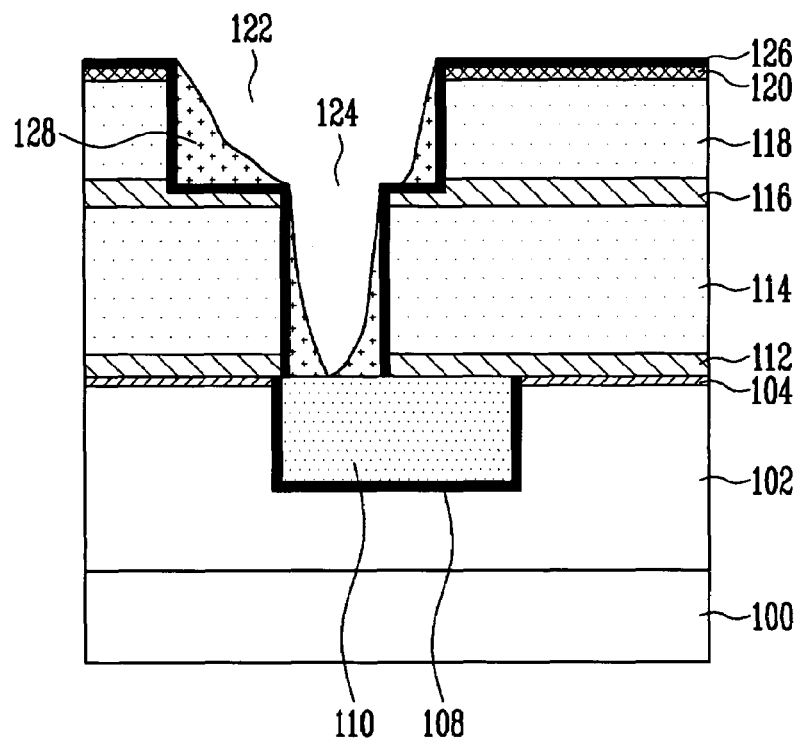
Figure 1H:
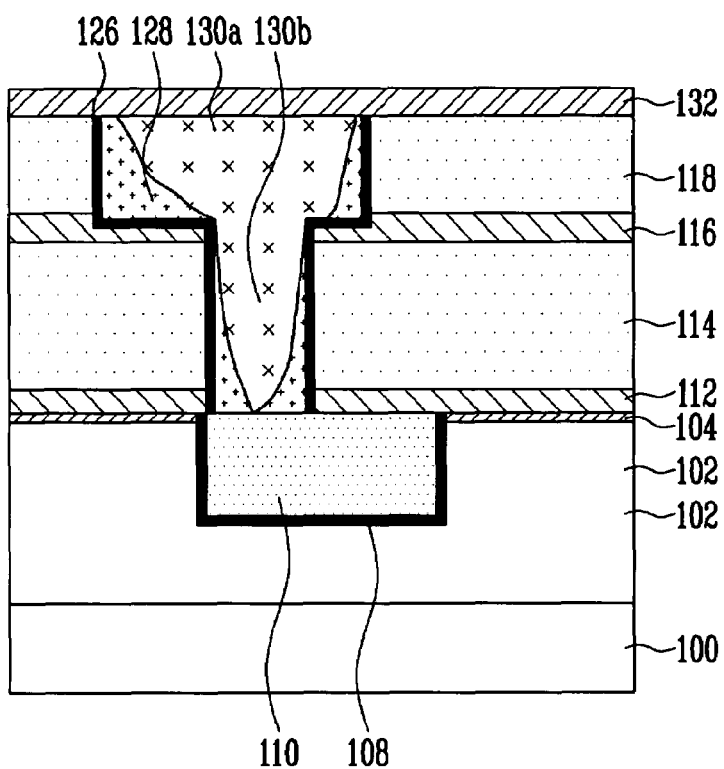

Referring to FIG. 1G, a heat treatment process causes the second metal layer 128 to flow downward or migrate into lower regions and along side surfaces of the second trench 122 and the via hole 124 constituting the dual damascene structure. The heat treatment process can be carried out at a temperature of 430° C. to 450° C. In the heat treatment step, the second metal layer 128 flows from side surfaces of the trench 122 and the via hole 124 to lower surfaces. As a result, the second metal layer 128 is formed on side walls and a bottom surface having the dual damascene structure.

Referring to FIG. 1G, a third metal layer is formed on the semiconductor substrate 100 including the second barrier metal layer 126 and the second metal layer 128 for filling the second trench 122 and the via hole 124 with the third metal layer. The third metal layer may be formed of copper by performing an electroplating method. In such case, the second trench 122 and the via hole 124 having the dual damascene structure are filled with copper by using the second metal layer 128 as the seed layer.

Then, a chemical mechanical polishing (CMP) step removes the third metal layer such that the third metal layer remains only in the second trench 122 and the via hole 124. Thus, a second metal wire 130a and a via plug 130b are formed. When a polishing process is performed to form the second metal wire 130a, the second hard mask layer 120 partially remaining on the third insulating layer 118 is also removed. A third etching stop layer 132 is formed on the semiconductor substrate 100 including the second metal wire 130a. The third etching stop layer 132 can be made of silicon carbonitride (SiCN).

As described above, because the aluminum layer which is the second metal layer 128 is used as a barrier, the generation of a void caused by diffusing metal ions from the third metal layer to the insulating layer, the penetration of metal ions into the insulating layer, and the generation of vacancies can be prevented. Consequently, the electro-migration (EM) failure or the stress-migration (SM) failure (i.e., a break of the metal wire itself) can be prevented.

In addition, the reliability of the metal wire can be enhanced by solving the above mentioned problems. Further, a specific resistance is lower than that of a metal wire formed by the conventional method is obtained by using an aluminum second metal layer 128 as a seed layer. Due to the above improvements, the RC delay problem is decreased. Thus, the operating ratio of the device is enhanced, the power consumption is reduced, and the reliability of the device can be improved.

Also, the time dependent dielectric breakdown (TDDB) characteristic is enhanced by increasing the reliability of the metal wire, and so it is possible to reduce the size of the device.

Although the technical spirit of the invention has been concretely described in connection with the preferred embodiment, the scope of the invention is not limited by the specific embodiments but should be construed by the appended claims. Further, it should be understood by those skilled in the art that various changes and modifications can be made thereto without departing from the scope of the invention.

The invention as described above has the following effects.

First, without depositing aluminum on the lower region of the via hole, most of the aluminum is deposited on the second trench region by chemical vapor deposition to form the second metal layer. A heat treatment process is then performed to cause the aluminum to flow in the second trench and the via hole forming the dual damascene structure, thereby using the aluminum layer as a barrier.

Second, since aluminum is used as the barrier, the generation of a void caused by diffusing copper ions to the insulating layer during a process for forming the metal layer utilizing copper, the penetration of copper ions into the insulating layer, and the generation of vacancies can be prevented.

Third, the prevention of the generation of the void, the penetration of copper ions, and the generation of vacancies also prevents electro-migration (EM) failure and stress-migration (SM) failure.

Fourth, preventing the above problems improves the reliability of the metal wire.

Fifth, a specific resistance lower than that of a conventional metal wire is obtained by using an aluminum second metal layer as a seed layer, and the resistance of the metal wire can be enhanced.

Sixth, the RC delay problem is decreased by reducing the resistance of the metal wire, and so the operating ratio of the device is enhanced, the power consumption is reduced, and the reliability of the device can be improved.

Seventh, the TDDB characteristic is enhanced by increasing the reliability of the metal wire, and so it is possible to reduce the size of the device.

What is claimed is:

1. A method of forming a metal wire in a semiconductor device, comprising the steps of:
    etching an insulating layer formed on a semiconductor substrate to form a dual damascene pattern;
    forming a barrier metal layer in the dual damascene pattern;
    forming a metal layer on the barrier metal layer;
    performing a heat treatment process, thereby causing the metal layer to migrate into a lower region of the dual damascene pattern; and
    filling the dual damascene pattern with a conductive material to form a metal wire.

2. The method of claim 1, wherein the insulating layer comprises a low dielectric material.

3. The method of claim 1, wherein the step of forming the barrier metal layer comprises depositing titanium (Ti) using a sputtering method.

4. The method of claim 1, wherein the metal layer comprises an aluminum layer formed using chemical vapor deposition (CVD).

5. The method of claim 1, wherein the metal layer has a thickness of 250 Å to 400 Å.

6. The method of claim 1, wherein the metal layer is hardly formed on a lower region of the dual damascene pattern, and most of the metal layer is formed on a side surface of an upper region of the dual damascene pattern.

7. The method of claim 1, comprising performing the heat treatment process at a temperature of 430°C. to 450°C.

8. A method of forming a metal wire in a semiconductor device, comprising the steps of:
    etching a first insulating layer formed on a semiconductor substrate to form a first trench;
    filling the first trench with a first metal layer to form a first metal wire;
    forming a first etching stop layer, a second insulating layer, a second etching stop layer, and a third insulating layer on the semiconductor substrate including the first metal layer;
    etching the third insulating layer, the second etching stop layer, the second insulating layer, and the first etching stop layer to form a dual damascene structure comprising a second trench and a via hole;
    forming a second metal layer on a region of the second trench;
    performing a heat treatment process, thereby causing the second metal layer to migrate into lower regions and along side surfaces of the second trench and the via hole; and,
    filling the second trench and the via hole with a third metal layer to form a second metal wire.

9. The method of claim 8, wherein the first, second, and third insulating layers comprise a low dielectric material.

10. The method of claim 8, further comprising the steps of:
    forming a palladium layer in the first trench; and,
    forming a barrier metal layer in the first trench before the step of filling the first trench.

11. The method of claim 10, comprising depositing the palladium layer using a sputtering method.

12. The method of claim 10, comprising forming the barrier metal layer by depositing tantalum (Ta) and tantalum nitride (TaN) using a sputtering method.

13. The method of claim 8, further comprising the step of forming a barrier metal layer in the second trench and the via hole prior to the step of forming the second metal layer.

14. The method of claim 13, comprising forming the barrier metal layer by depositing titanium (Ti) using a sputtering method.

15. The method of claim 8, comprising forming the second metal layer by depositing aluminum (Al) using a chemical vapor deposition (CVD) method.

16. The method of claim 8, wherein the second metal layer has a thickness of 250 Å to 400 Å.

17. The method of claim 12, further comprising the step of etching the portion of the barrier metal layer formed on the first metal wire before performing the heat treatment process.

18. The method of claim 17, wherein the portion of the the second metal layer formed in the second trench and on the barrier metal layer is partially removed when etching the barrier metal layer.

19. The method of claim 8, comprising performing the heat treatment process at a temperature of 430°C. to 450°C.

20. The method of claim 8, wherein the third metal layer comprises a copper layer formed through an electroplating method using the second metal layer as a seed layer.

* * * * *